United States Patent [19]

Kabeshita et al.

[11] Patent Number: 4,829,664
[45] Date of Patent: May 16, 1989

[54] METHOD FOR MOUNTING ELECTRONIC COMPONENTS

[75] Inventors: Akira Kabeshita; Tokuhito Hamane, both of Hirakata; Souhei Tanaka, Neyagawa, all of Japan

[73] Assignee: Matsushita Electric Industrial Co., Ltd., Kadoma, Japan

[21] Appl. No.: 122,994

[22] Filed: Nov. 19, 1987

[30] Foreign Application Priority Data

Nov. 20, 1986 [JP] Japan .................................. 61-277252

[51] Int. Cl.$^4$ ............................................... H05K 3/30
[52] U.S. Cl. ......................................... 29/840; 29/834; 29/740
[58] Field of Search ................. 29/832, 834, 840, 739, 29/740

[56] References Cited

U.S. PATENT DOCUMENTS 4,526,646 7/1985 Suzuki et al. ..................... 29/740 X Primary Examiner—Carl E. Hall
Assistant Examiner—Taylor J. Ross
Attorney, Agent, or Firm—Cushman, Darby & Cushman

[57] ABSTRACT

Electronic components are adhesively held by a flexible, expansible and contractible adhesive sheet, and pressing pins pressing one of the electronic component on a position to be mounted on a printed circuit substrate with penetrating the adhesive sheet. Then, electronic component is separated from the adhesive sheet by bringing up the adhesive sheet and at that time the electronic component is fixed on the printed circuit substrate by the pressing pins.

3 Claims, 6 Drawing Sheets

METHOD FOR MOUNTING ELECTRONIC COMPONENTS

FIELD OF THE INVENTION AND RELATED ART STATEMENT

1. FIELD OF THE INVENTION

The present invention relates to a method for mounting electronic components on a printed circuit substrate.

2. DESCRIPTION OF THE RELATED ART

In order to mount electronic components on a printed circuit substrate, a generally adopted conventional method for mounting the electronic components is shown in FIG. 8. The conventional method for mounting the electronic components has the following steps:

taking the electronic components 11 successively out of a component supplying unit 12 by applying suction thereto with suction nozzle 13, (The component supplying unit 12 has a tray or a tape on which the electronic components 11 are lined up in order and received);

orienting the position of the electronic components 11 picked up by the suction nozzle 13 with an orienting means;

applying adhesive 15 at positions on a printed circuit substrate 14 where the electronic components are to be mounted, and/or applying soldering paste 16 at positions on conductive lands 17 of the printed circuit substrate 14 where the electronic components are to be soldered;

fixing the electronic components 11 provisionally on the positions where the electronic components 11 are to be mounted by pressing against the adhesive 15 or the soldering paste 16 by lowering the suction nozzle 13; and contacting and regularly fixing the electronic components 11 with the conductive lands 17 and electrically connecting it by soldering the the terminals of the electronic components 11 and the conductive lands 17 by dipping of the solder or reflow of the soldering paste 16.

On the other hand, the Japanese examined published Patent application Sho 61-30737 shows a method for mounting electronic components in which the electronic components 20 having bump electrodes 21 are fixed on the conductive lands 25 of the printed circuit substrate 24 by inter-metallic bonding. The inter-metallic bonding method for mounting electronic components is shown in FIG. 9(A), FIG. 9(B), and FIG. 9(C) and has the following steps:

holding the electronic components 20 on an adhesive sheet 23;

contacting the bump electrodes 21 with the conductive lands 25 of the printed circuit substrate 24 with the adhesive sheet 23 by lowering a tool 26 having hollow space 26A;

pressing the electronic components 20 against the conductive lands 25 of the printed circuit substrate 24 by making a pin 27 penetrate the adhesive sheet 23;

peeling the electronic components 20 from the adhesive sheet 23 by raising the tool 26 and the adhesive sheet 23;

separating the electronic components 20 from the adhesive sheet 23 without unexpected moving by separating the penetrating pin 27 from the electronic components 20; and inter-metallicaly connecting the bump electrodes 21 of the electronic components 20 and the conductive lands 25 of the printed circuit substrate 24 with a bonding tool (not shown in the figure).

Thus, in the above-mentioned method for mounting the electronic components shown in FIG. 8, the electronic components 11 are only placed on the printed circuit substrate 14 by provisional fixing. Therefore, mispositioning of the electronic components 11 may occur because of the low adhesion ability of the adhesive 14 and of low viscosity of the adhesive 14 or the soldering paste 17. And also poor suction of the micro-electronic components 11 by the suction nozzle 13 may occur.

On the other hand, the method shown in Sho 61-30737 is applied only on mounting of inter-metallic bonding. In that method, the electronic component 20 is pressed by only one penetrating pin 27 and therefore the electronic component 20 may be moved when the adhesive sheet 23 is peeled off. In addition, electronic component 20 may be unexpectedly moved after separating of the penetrating pin 27, or when the bonding tool (not shown) makes contact with the electronic component 20.

If the conventional method shown in FIG. 8 and the conventional method shown in FIG. 9(A), FIG. 9(B), and FIG. 9(C) were combined, when the adhesive 15 or the soldering paste 16 is used for provisionally fixing the electronic components 11/20 on the printed circuit substrate 14/24, while the electronic component 11/20 would not be moved unexpectedly while the electronic components 11/20 are held by the adhesive sheet 23. However, when the electronic component is pressed with the single pin 27, the electronic component 11/20 may be moved when the adhesive sheet 23 is peeled off, as in the above-mentioned case.

OBJECT AND SUMMARY OF THE INVENTION

The object of the present invention is to provide an improved method for mounting electronic components wherein electronic components are not moved unexpectedly during mounting, and mis-positioning does not occur even when the electronic components are very small.

A method for mounting electronic components in accordance with the present invention has steps of:

positioning a flexible, expansible and contractible adhesive sheet for holding electronic components at a position spaced from a printed circuit substrate by a predetermined distance, causing one of the electronic components to face a position on the printed circuit substrate where one of electronic components is to be mounted, fixing the electronic component at the position on the printed circuit substrate with the flexible, expansible and contractible adhesive sheet, pressing and positioning the electronic component with pins which serve as pressing means and positioning means, and separating the pressed electronic components from the flexible, expansible and contractible adhesive sheet by parting the flexible, expansible and contractible adhesive sheet from said printed circuit substrate.

By using this method, the electronic components are fixed with the pressing pins which serve as holding means and positioning means being held by the adhesive sheet, and the electronic components are peeled off from the adhesive sheet maintaining their accurate disposition. Therefore, the electronic components will not be moved unexpectedly and the mis-positioning of the electronic components does not occur because the electronic components are not moved. As a result, the micro-electronic components can be precisely mounted.

DESCRIPTION OF THE PREFERRED EMBODIMENTS

A preferred embodiment of the method for mounting electronic components in accordance with the present invention will now be described with reference to FIG. 1(A), FIG. 1(B), FIG. 1(C), FIG. 2, FIG. 3 and FIG.4.

Figure 2:
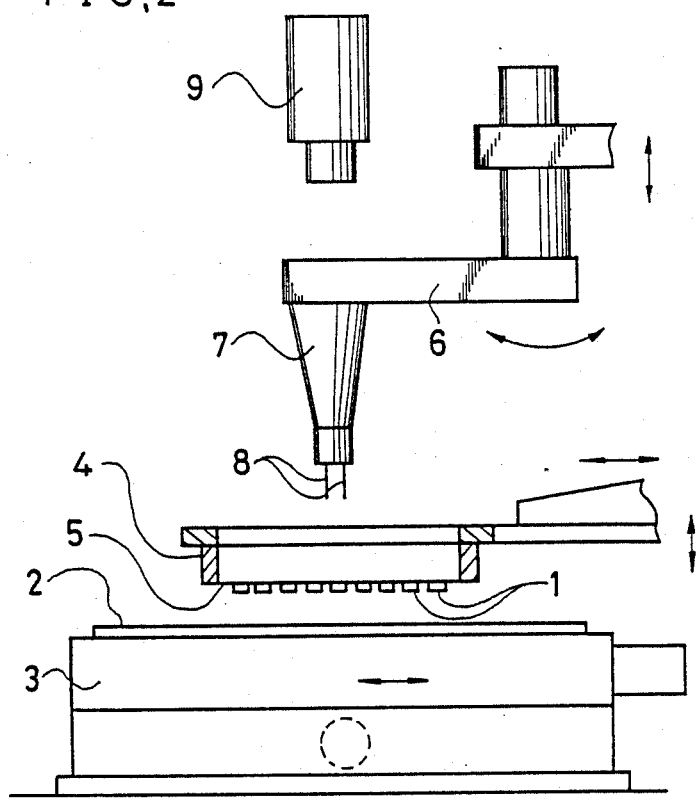
FIG. 2 is a drawing showing a mounting apparatus for mounting electronic components on a printed circuit substrate.
Figure 3:
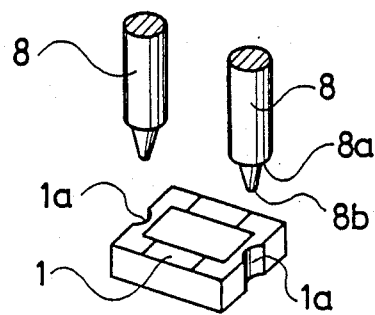
FIG. 3 is a drawing showing a perspective view of pressing pins 8 and electronic components 1 shown in FIG. 2.

In FIG. 2, a printed circuit substrate 2 on which electronic components 1 are to be mounted is fixed on a table 3. The table 3 is horizontally movable in two directions crossing at right angle, and can be precisely positioned. A circular frame 4 is disposed above the table 3 and is horizontally movable and can be vertically raised and lowered. An adhesive sheet 5 for adhesively holding the electronic components 1 is held by the circular frame 4 about its periphery. The adhesive sheet 5 is made of a flexible expansible and contractible material, for instance, a sheet of synthetic rubber. Therefore, the adhesive sheet 5 will not be broken by the penetration of pressing pins 8 (as later described) and the subsquent expansion. A rotary arm 6 is disposed above the circular frame 4 and is rotatable around a position aside from the center of the table 3 and can be raised and lowered. A pressing part 7 extends downwardly from the front end of the rotary arm 6. A pair of pressing pins 8 are disposed on the bottom of the pressing part 7. The pressing pins 8 respectively have a downward offset part 8a for pressing the upper surface of the electronic components 1 and a tapered end part 8b, for positioning the electronic parts 1 by fitting one of semicylindrical concave components 1a which are formed on both side components of the electronic component 1 as shown in FIG. 3. Above the rotary arm 6, a camera 9 is disposed for facing the center of the table 3 so as to detect the position of the printed circuit substrate 2. The center axis of the camera 9 coincides with the center axis of the pressing part 7 when the rotary arm 6 reaches the center of the table 3.

The process for mounting the electronic components 1 on the printed circuit substrate 2 in the abovementioned apparatus will now be described.

At first, under the condition that the circular frame 4 and the rotary arm 6 are shunted from the central part of the table 3, the standard position of the substrate 2 which is fixed on the table 3 is detected by the camera 9. After that, the table 3 is moved to align a position on the printed circuit substrate 2 where one of the electronic component 1 is to be mounted with the center axis of the camera 9. (This process is not shown in the drawings.)

Adhesive is applied on the position on the printed circuit substrate 2 by an adhesive supplier (not shown in the drawings).

Figure 1A:
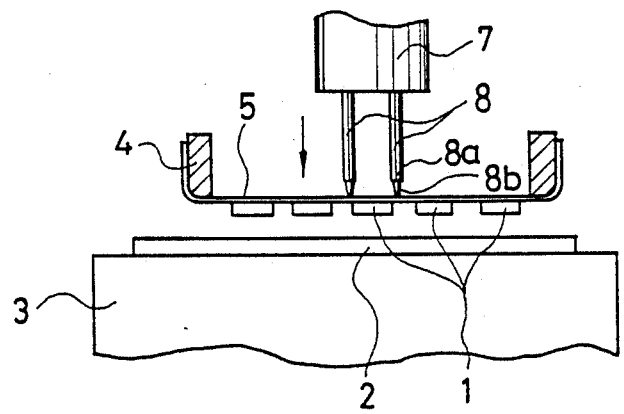
FIG. 1(A), FIG. 1(B) and FIG. 1(C) are drawings showing a preferred embodiment of a method for mounting electronic components in accordance with the present invention.

Next, the circular frame 4 is moved above the table 3 for aligning the center of the electronic component 1 with the center axis of the camera 9. After that, the circular frame 4 is brought down for positioning the adhesive sheet 5 which holds the electronic components 1, at a position which is spaced from and above the printed circuit substrate 2 by a predetermined distance, as shown in FIG. 1(A).

During the above-mentioned step, the rotary arm 6 is rotated for aligning the center axis of the pressing part 7 with the center axis of the camera 9. After that, the electronic component 1 which is to be mounted is pressed with the adhesive sheet by the pressing pins 8 in the direction of the arrow in FIG. 1(A) by lowering the rotary arm 6.

Figure 1B:
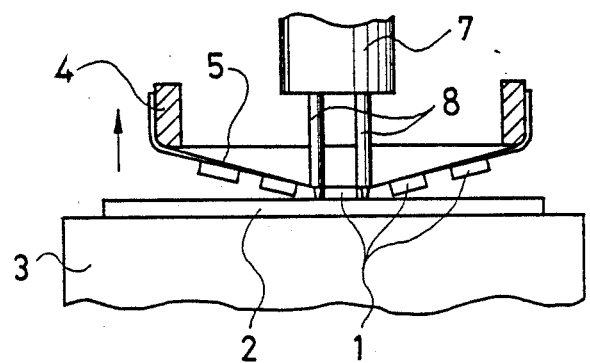

As a result, the electronic component 1 contacts the printed circuit substrate 2 and is provisionally fixed by the adhesive (not shown), as shown in FIG. 1(B).

Figure 1C:
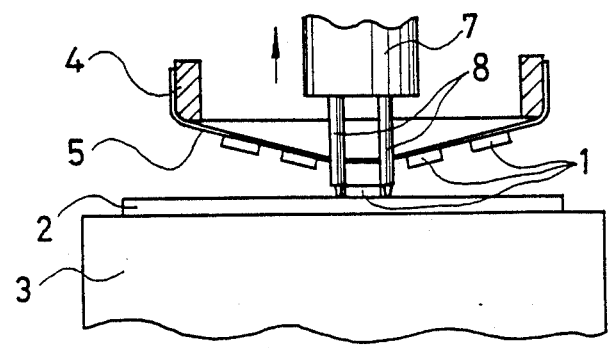
Figure 4:
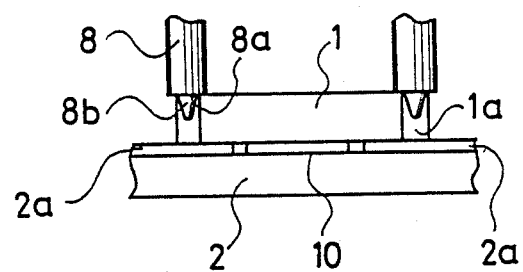
FIG. 4 is a drawing showing a side view of the electronic components 1 and the pressing pins 8 on a printed circuit substrate 2.

Then, with the electronic component 1 positioned and fixed by the pressing pins 8, the circular frame 4 is raised in the direction of the arrow in FIG. 1(B). Then, the electronic component 1 is separated from the adhesive sheet 5, as shown in FIG. 1(C). At that time, the electronic component 1 is pressed by the offset parts 8a of the pressing pins 8 and positioned by the tapered parts 8b, so that the electronic component 1 will not move. Thus, the electronic component 1 is provisionally fixed on the printed circuit substrate 2 by the adhesive 10 under the condition that the electrodes of the electronic component 1 contact with the conductive lands 2a of the printed circuit substrate 2, as shown in FIG. 4.

After that, by raising the rotary arm 6 in the direction of the arrow in FIG. 1(C), and moving the pressing pins 8 from the electronic component 1, mounting and provisional fixing of the electronic component 1 is finished.

When the mounting of all the electronic components 1 on the printed circuit substrate 2 is completed by repeating the above-mentioned steps, the printed circuit substrate 2 is taken from the table 3 and all the electronic components 1 are regularly fixed and the terminals of the electronic components 1 and the conductive lands 2a of the printed circuit substrate 2 are electrically connected by a dipped solder in a later dipping of soldering process.

Figure 5:
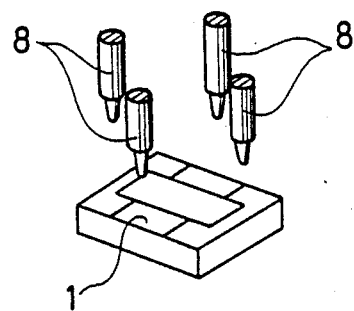
FIG. 5 is a drawing showing a perspective view of another working example of the pressing pins 8 and the electronic components 1.

The above mentioned embodiment is described for the case of using the electronic components 1 having semi-cylindrical convex parts 1a on both sides, and the electronic components 1 are positioned by a pair of pressing pins 8. But, the electronic component 1 may be held at its four sides by using four respective pressing pins 8 when the electronic components 1 do not have any semi-cylindrical convex part 1a, as shown in FIG. 5.

Figure 6:
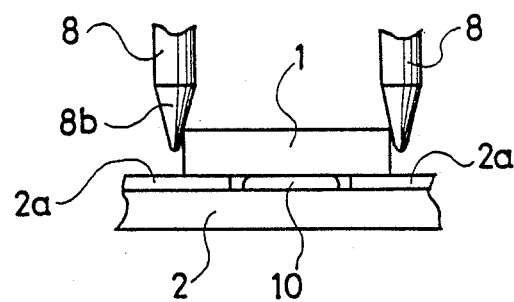
FIG. 6 is a drawing showing a side view of the electronic components 1 and the pressing pins 8 on the printed circuit substrate shown in FIG. 5.

Furthermore, apart from the above-mentioned embodiment wherein the each pressing pins 8 has the offset part 8a for pressing the electronic component 1 and the tapered part 8b for positioning the electronic component 1. Another working example of the pressing pins 8 may be made as shown in FIG. 6. The pins 8 can replace the pressing pins 8 shown in FIG. 4, so that the pressing pins 8 have only tapered part 8b without any offset part 8a. The tapered part 8b serves as a pressing means and a positioning means by holding the electronic components 1 at its tapered surface.

Furthermore, in the above-mentioned embodiment, the electronic components 1 are provisionally fixed by the adhesive 10, the soldering paste may be used for provisional fixing and the regular fixing of the electronic components 1 and the conductive lands 2a of the printed circuit substrate 2 can be done by reflow of the soldering paste. But the electronic components 1 may be completely fixed on the printed circuit substrate 2 by only being pressed.

Figure 7:
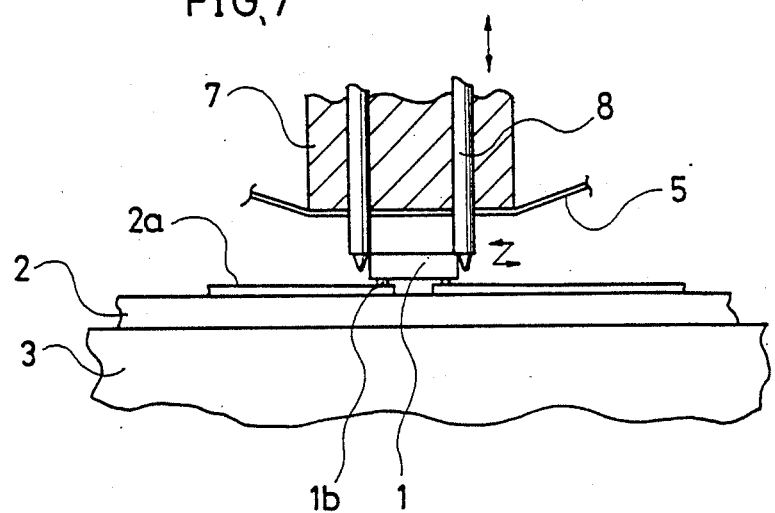
FIG. 7 is a drawing showing another embodiment of a method for mounting electronic components in accordance with the present invention.
Figure 8:
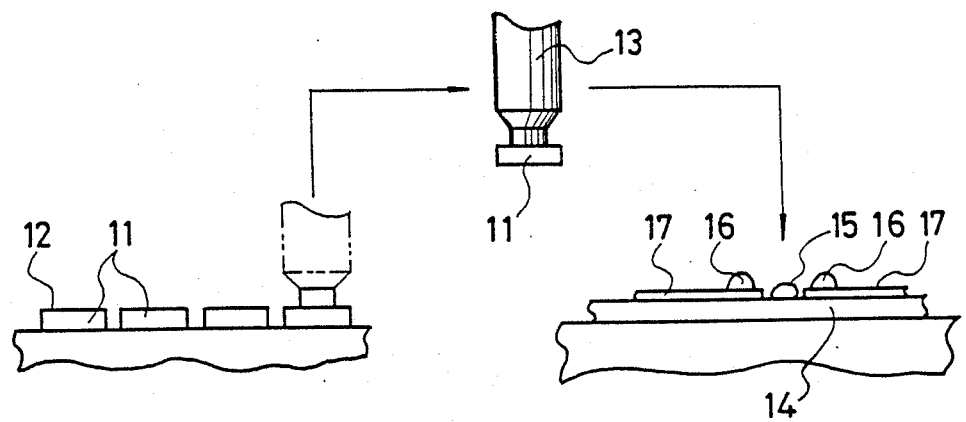
FIG. 8 is the drawing showing the conventional method for mounting electronic components.
Figure 9A:
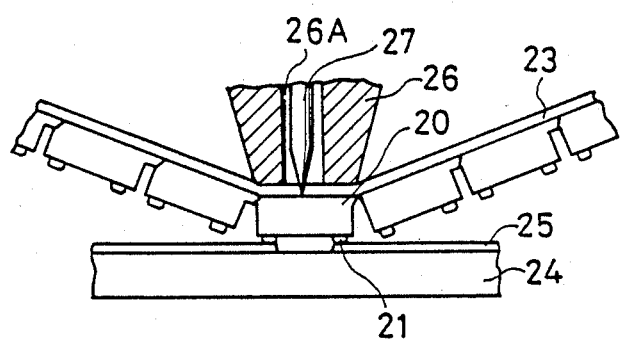
FIG. 9(A), FIG. 9(B) and FIG. 9(C) are drawings showing another conventional method for mounting electronic components.
Figure 9B:
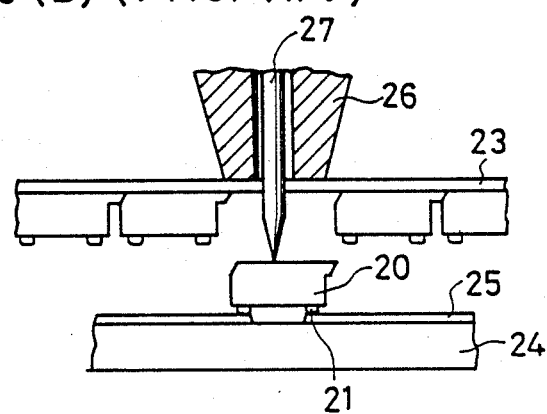
Figure 9C:
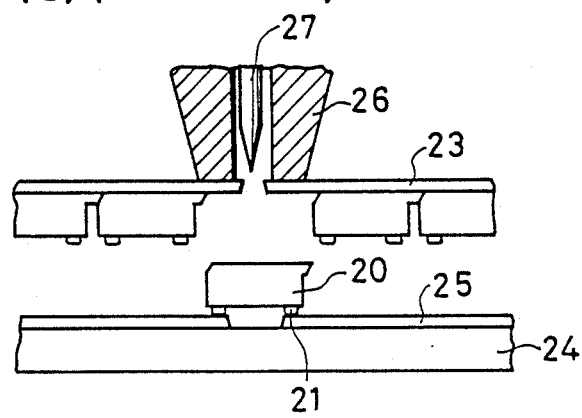

Another preferred embodiment of a method for mounting electronic components in accordance with the present invention is described now, with reference to FIG. 7. In this embodiment, the electronic components 1 have bump electrodes 1b on its peripheral parts. The other constitutions and the conditions for mounting the electronic components 1 on the printed circuit substrate 2 are the same as the above mentioned embodiment. Namely, this embodiment is a case for applying the above mentioned embodiment to the method shown in the Japanese published examined patent application Sho 61-30737.

It is possible to regularly fix one of the electronic components 1 on the printed circuit substrate 2 and to connect the bump electrodes 1b of the electronic components 1 and the conductive lands 2a of the printed circuit substrate 2 at the same time by applying ultrasonic energy to the pressing pins 8 which holds and positions the electronic component 1, after separating the electronic component 1 from the adhesive sheet 5 by raising the circular frame 4.

What is claimed is:

1. Method for mounting electronic components comprising the steps of:
   mounting at least one electronic component to a flexible, expansible and contractible adhesive sheet;
   positioning said flexible, expansible and contractible adhesive sheet at a position spaced a predetermined distance from a printed circuit substrate with said at least one electronic component in facing relation to the printed circuit substrate;
   moving said flexible, expansible and contractible adhesive sheet so that one of said at least one electronic components is in facing relation to a position on said printed circuit substrate where said one electronic component is to be mounted;
   fixing said one electronic component to said position on said printed circuit substrate with said flexible, expansible and contractible adhesive sheet coupled thereto by pressing and positioning said one electronic component with pressing and positioning means including first and second pin elements; and
   separating said pressed and positioned electronic component from said flexible, expansible and contractible adhesive sheet and moving said flexible expansible and contractible adhesive sheet away from said printed circuit substrate.

2. Method for mounting electronic components comprising the steps of:
   mounting at least one electronic component to a flexible, expansible and contractible sheet;
   positioning said flexible, expansible and contractible adhesive sheet at a position spaced a predetermined distance from a printed circuit substrate with said at least one electronic component in facing relation to the printed circuit substrate;
   moving said flexible, expansible and contractible adhesive sheet so that one of said at least one electronic components is in facing relation to a position on said printed circuit substrate where said one electronic component is to be mounted;
   provisionally fixing said one electronic component to said position on said printed circuit substrate with said flexible, expansible and contractible adhesive sheet coupled thereto by pressing and positioning said one electronic component with pressing and positioning means including at least first and second pressing pin elements;
   separating said one electronic component from said flexible, expansible and contractible adhesive sheet by moving said flexible, expansible and contractible adhesive sheet away from said printed circuit substrate;
   firmly fixing said one electronic component to said position on said printed circuit substrate; and
   electrically connecting said one electronic component with conductive leads of said printed circuit substrate.

3. Method for mounting electronic components comprising the steps of:
   mounting at least one electronic component to a flexible expansible and contractible sheet;
   positioning said flexible, expansible and contractible adhesive sheet at a position spaced a predetermined distance from a printed circuit substrate with said at least one electronic component in facing relation to the printed circuit substrate;
   moving said flexible, expansible and contractible sheet so that one of said at least one electronic components is in facing relation to a position on said printed circuit substrate where said one electronic component is to be mounted;
   pressing and positioning said one electronic component to said position on said printed circuit substrate with pressing means and positioning means including at least first and second penetrating pin elements;
   fixing said one electronic component to said position on said printed circuit substrate and electrically connecting said one electronic component with conductive leads of said printed substrate by applying ultrasonic energy to said penetrating pin elements; and
   separating said one electronic component from said flexible, expansible and contractible adhesive sheet by moving said flexible, expansible and contractible adhesive sheet away from said printed circuit substrate.

* * * * *